(12) United States Patent
Kobayashi

(10) Patent No.: US 8,142,595 B2
(45) Date of Patent: Mar. 27, 2012

(54) MOUNTING APPARATUS AND MOUNTING METHOD

(75) Inventor: Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/060,921

(22) PCT Filed: Aug. 27, 2009

(86) PCT No.: PCT/JP2009/064910
§ 371 (c)(1),
(2), (4) Date: Feb. 25, 2011

(87) PCT Pub. No.: WO2010/026909
PCT Pub. Date: Mar. 11, 2010

(65) Prior Publication Data
US 2011/0155314 A1 Jun. 30, 2011

(30) Foreign Application Priority Data
Sep. 4, 2008 (JP) .................................. 2008-226916

(51) Int. Cl.
*B29C 65/50* (2006.01)
*B29C 63/00* (2006.01)

(52) U.S. Cl. ........ 156/247; 156/701; 156/714; 156/715; 156/750

(58) Field of Classification Search .................. 156/247, 156/267, 701, 379.8, 510, 540, 714, 715, 156/750
See application file for complete search history.

(56) References Cited

U.S. PATENT DOCUMENTS

| | | | |
|---|---|---|---|
| 5,891,298 A | 4/1999 | Kuroda et al. | |
| 6,149,758 A * | 11/2000 | Tsujimoto et al. | 156/701 |
| 7,789,988 B2 * | 9/2010 | Yamamoto et al. | 156/247 |
| 7,846,288 B2 * | 12/2010 | Larson et al. | 156/247 |
| 7,849,900 B2 * | 12/2010 | Miyamoto et al. | 156/379.8 |
| 2002/0094760 A1 * | 7/2002 | Lim | 451/41 |
| 2006/0068524 A1 | 3/2006 | Yamamoto | |
| 2007/0269962 A1 | 11/2007 | Kawashima et al. | |
| 2007/0284028 A1 | 12/2007 | Kawashima et al. | |
| 2007/0284038 A1 | 12/2007 | Yamamoto et al. | |
| 2009/0011525 A1 * | 1/2009 | Yamamoto et al. | 438/7 |
| 2009/0065144 A1 * | 3/2009 | Yamamoto et al. | 156/344 |

(Continued)

FOREIGN PATENT DOCUMENTS

JP 63137449 A 6/1988

(Continued)

OTHER PUBLICATIONS

English Abstract of JP 2009-94132A (Jul. 31, 2011).*

(Continued)

*Primary Examiner* — Sing P Chan
(74) *Attorney, Agent, or Firm* — Lowe Hauptman Ham & Berner LLP

(57) ABSTRACT

To provide a mounting apparatus for uniting a semiconductor wafer with a ring frame, the wafer having an adhesive sheet stuck on one surface thereof. In the mounting apparatus, a portion of the adhesive sheet is preliminarily peeled off through a preliminary peeling means, the wafer is disposed inside the ring frame after a preliminarily peeled portion is formed, and a mounting tape is stuck to the ring frame and the wafer through a sticking means. The mounted wafer is fully peeled off by holding the preliminarily peeled portion.

9 Claims, 4 Drawing Sheets

U.S. PATENT DOCUMENTS

2010/0181019 A1   7/2010   Kino et al.

FOREIGN PATENT DOCUMENTS

| | | | |
|---|---|---|---|
| JP | 02125440 A | * | 5/1990 |
| JP | 2006100728 A | | 4/2006 |
| JP | 2007311612 A | | 11/2007 |
| JP | 2007311735 A | | 11/2007 |
| JP | 2007329315 A | | 12/2007 |
| JP | 200965108 A | | 3/2009 |
| JP | 2009060039 A | | 3/2009 |
| JP | 2009094132 A | * | 4/2009 |
| JP | 2009141314 A | | 6/2009 |
| JP | 2009297636 A | | 12/2009 |
| WO | 9708745 A1 | | 3/1997 |

OTHER PUBLICATIONS

English Abstract of JP 02-125440 (Jul. 31, 2011).*

International Search Report for PCT/JP2009/064910 mailed Sep. 29, 2009.

* cited by examiner

MOUNTING APPARATUS AND MOUNTING METHOD

The present application is national phase of PCT/JP2009/064910 filed Aug. 27, 2009, and claims priority from, Japanese Application Number 2008-226916, filed Sep. 4, 2008.

FIELD OF THE INVENTION

The present invention relates to a mounting apparatus and mounting method, and in particular a mounting apparatus and mounting method capable of uniting a semiconductor wafer with a ring frame in a state that an adhesive sheet stuck on the semiconductor wafer is easily peelable.

BACKGROUND OF THE ART

A semiconductor wafer (hereinafter, simply referred to as "wafer") is united (mounted) with a ring frame via a mounting tape in view of the handleability thereof when subjected to various processes, in particular a dicing process. Here, a protective adhesive sheet is stuck on the device forming surface side of the wafer, the adhesive sheet being peeled off in a downstream process.

Patent document 1 discloses a sheet peeling apparatus for peeling off an adhesive sheet via a peeling tape in a state that a wafer is mounted on a ring frame.

[Patent document 1] WO97/08745

SUMMARY OF THE INVENTION

Problem to be Solved by the Invention

However, in the sheet peeling apparatus disclosed in Patent document 1, the adhesive sheet stuck on the wafer is not peeled off from the wafer unless the adhesive sheet is peeled off from an outer edge thereof, and thus the peeling tape is stuck as close to an outer edge portion of the adhesive sheet as possible. Therefore, there is such a disadvantage that sometimes the peeling tape adheres to an adhesive layer of a mounting tape exposed from the outer circumference of the wafer, and pulling the peeling tape while remaining in such a state leads to damage to the wafer. Accordingly, it is required to take a measure separately such as placing a thin plate therebetween to prevent the peeling tape from adhering to the mounting tape.

Object of the Invention

The present invention has been proposed in view of the above disadvantages. It is an object of the present invention to provide a mounting apparatus and mounting method capable of uniting a wafer with a ring frame while maintaining an adhesive sheet stuck on the wafer in an easily peelable state.

Means for Solving Problems

In order to achieve the above object, the present invention adopts such an arrangement that a mounting apparatus for uniting a semiconductor wafer with a ring frame by sticking a mounting tape to the semiconductor wafer and the ring frame, comprises: a preliminary peeling means for forming a preliminarily peeled portion by preliminarily peeling off a portion of an adhesive sheet from the semiconductor wafer having the adhesive sheet stuck on one surface of the wafer; and a sticking means for sticking the mounting tape to the ring frame and the other surface of the semiconductor wafer, by disposing, inside the ring frame, the semiconductor wafer with the preliminarily peeled portion formed in the adhesive sheet.

In the present invention, such an arrangement is preferably adopted which further comprises an alignment means for the semiconductor wafer, wherein the preliminary peeling means is provided to the alignment means.

Also, such an arrangement may be adopted which comprises a full peeling means for peeling off the adhesive sheet from the semiconductor wafer by holding the preliminarily peeled portion.

Further, such an arrangement is adopted which comprises a non-adhesive treatment means for preventing an adhesive layer of the preliminarily peeled portion from re-adhering to the semiconductor wafer.

Also, the present invention adopts such a method that a mounting method for uniting a semiconductor wafer with a ring frame by sticking a mounting tape to the semiconductor wafer and the ring frame, comprises steps of: forming a preliminarily peeled portion by preliminarily peeling off a portion of an adhesive sheet from the semiconductor wafer having the adhesive sheet stuck on one surface of the wafer; and sticking the mounting tape to the ring frame and the other surface of the semiconductor wafer by disposing, inside the ring frame, the semiconductor wafer with the preliminarily peeled portion formed in the adhesive sheet.

The mounting method preferably comprises a step of fully peeling off the adhesive sheet from the semiconductor wafer by holding the preliminarily peeled portion after sticking the mounting tape.

Further, in the mounting method, such an arrangement may be adopted which, may comprises a step of a non-adhesive treatment for preventing an adhesive layer of the preliminarily peeled portion from re-adhering to the semiconductor wafer after preliminarily peeling off the portion of the adhesive sheet.

Effect of the Invention

According to the present invention, such an arrangement is adopted that the portion of the adhesive sheet stuck on the wafer is preliminarily peeled off, and the wafer is mounted in the ring frame in a state that the preliminarily peeled portion is formed. Therefore, when the adhesive sheet is peeled off from the wafer, it is not required that the peeling tape is stuck as close to the outer edge portion of the adhesive sheet as possible, since the adhesion of the preliminarily peeled portion is reduced. Moreover, peeling can be performed by holding the preliminarily peeled portion without using the peeling tape. Further, peeling can be performed by taking up the preliminarily peeled portion with fingertips, and this can add variety to the peeling method.

Also, by providing the preliminary peeling means to the alignment means for the semiconductor wafer, the table for performing alignment can be shared in preliminary peeling, this being capable of utilizing a space effectively, and shortening preliminary peeling process time.

Further, the arrangement including the full peeling means enables removal of the adhesive sheet within the mounting apparatus.

Furthermore, the arrangement including the non-adhesive treatment means enables the preliminary peeling portion to be easily peeled off from the wafer even when the adhesive sheet has been pressed to the wafer in a mounting process.

BRIEF DESCRIPTION OF THE DRAWINGS

FIG. 1 is viewed from an arrow a.

FIG. 1 is viewed from an arrow b.

FIG. 1 is viewed from an arrow c.

EXPLANATION OF REFERENCE NUMERALS

Figure 1:
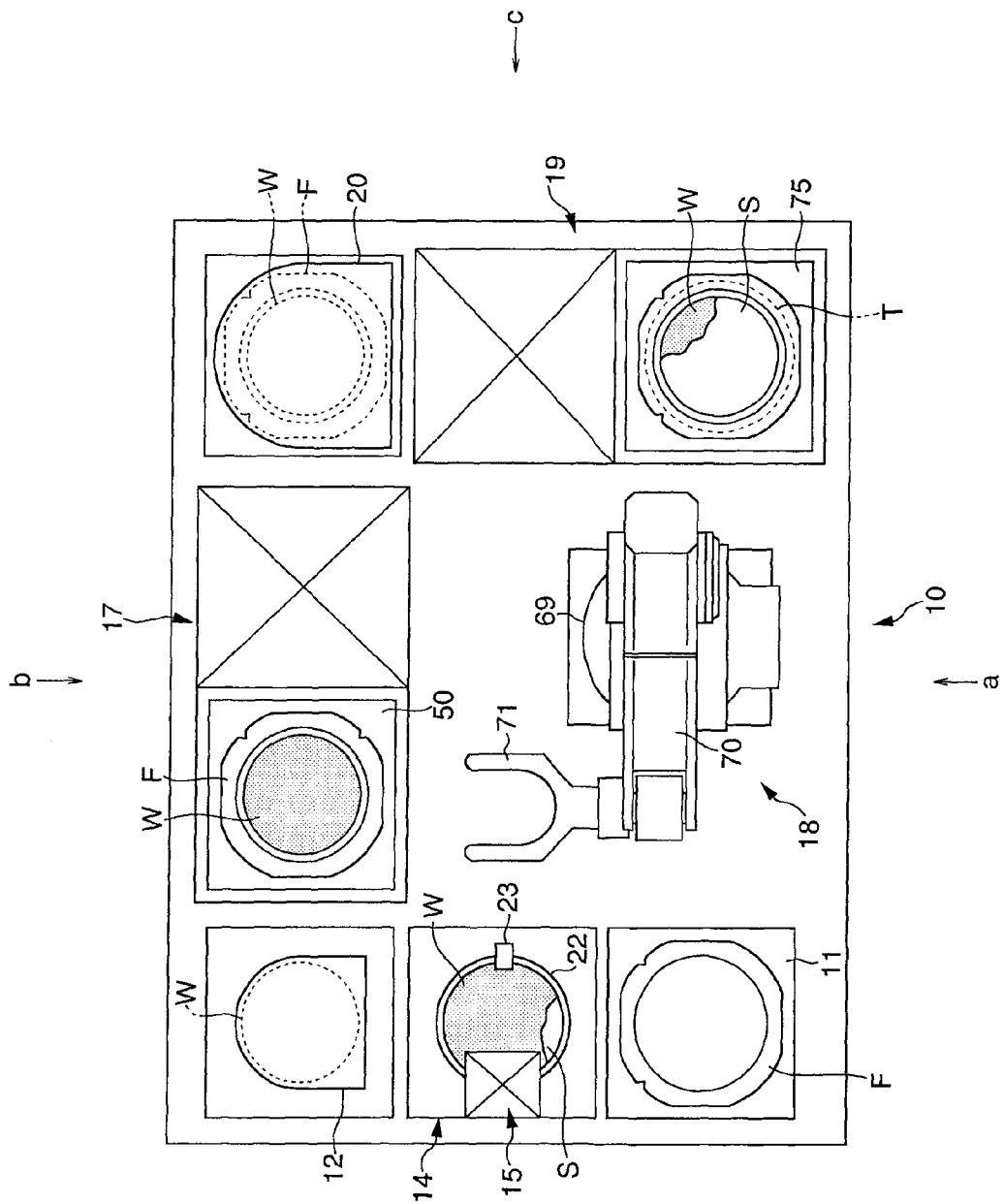
FIG. 1 is a schematic plan view showing an overall configuration of a mounting apparatus according to the embodiment.

10: mounting apparatus
14: alignment means
15: preliminary peeling means
17: sticking means
19: full peeling means
35: ultraviolet ray irradiating apparatus (non-adhesive treatment means)
F: ring frame
S: adhesive sheet
S1: preliminarily peeled portion
T: mounting tape
W: semiconductor wafer

DESCRIPTION OF THE PREFERRED EMBODIMENTS

Hereinafter, embodiments of the present invention are described with reference to the drawings.

FIG. 1 shows a schematic plan view of a mounting apparatus according to the embodiment. In this figure, a mounting apparatus 10 comprises: a frame stocker 11 for storing a ring frame F; a wafer stocker 12 for storing a wafer W having an adhesive sheet S stuck on one surface thereof; an alignment means 14 disposed between the stockers 11 and 12; a preliminary peeling means 15 that is provided on the alignment means 14, and forms a preliminarily peeled portion S1 (see FIG. 2(B)) by preliminarily peeling off a portion of the adhesive sheet S; a sticking means 17 for sticking a mounting tape T (see FIG. 3) to the other surface of the wafer W and the ring frame F to unite them; a transfer means 18 for transferring the ring frame F and the wafer W; a full peeling means 19 for fully peeling off the adhesive sheet S from the mounted wafer W; and a product stocker 20 for storing the mounted wafer W after the adhesive sheet S was peeled off. Note that the adhesive sheet S in the embodiment is stuck on the wafer via an ultraviolet curable adhesive layer.

The alignment means 14 includes a rotating table 22 for supporting the wafer W which is transferred through the transfer means 18, and a detecting means 23 disposed above an outer periphery side of the rotating table 22. The detecting means 23 includes an imaging camera, an area sensor, a line sensor or the like. The detecting means 23 is configured to scan an outer periphery of the wafer W by rotating the rotating table 22, and detect the center position of the wafer W and a reference position of a V-notch, an orientation flat, or the like (not shown), so that the wafer W is transferred to subsequent steps based on such center position and reference position.

The preliminary peeling means 15, as shown in FIG. 2, includes a uniaxial robot 24 disposed above the rotating table 22, and a partially peeling unit 26 supported by a slider (not shown) of the uniaxial robot 24 and capable of moving in a left and right direction in the figure. The partially peeling unit 26 comprises: a support shaft 29 supported by a moving frame 27 and supporting a peeling tape PT; a winding shaft 30 for winding the peeling tape PT; a press roller 32 disposed between the support shaft 29 and the winding shaft 30, and provided to be capable of moving up and down through a cylinder 31; and first and second driving devices 33 and 34 for feeding out and rewinding the peeling tape PT. The first and second driving devices 33 and 34 include drive rollers 37 and 38 which are driven by motors M1 and M2, and pinch rollers 40 and 41 for pinching the peeling tape PT between the drive rollers 37 and 38 and the pinch rollers 40 and 41, respectively. Such an arrangement enables the preliminarily peeled portion S1 to be formed by preliminarily peeling off a portion of the adhesive sheet S. Moreover, the preliminary peeling means 15 is provided together with an ultraviolet ray irradiating apparatus 35 as a non-adhesive treatment means for irradiating an adhesive agent layer portion of the adhesive sheet S with ultraviolet rays.

As shown in FIG. 3, the sticking means 17, which supports the wafer W and the ring frame F, includes: a mounting table 50 supported by a slider 54 of a uniaxial robot 51 and capable of moving in a left and right direction in the figure; and a sticking unit 52 disposed above the mounting table 50. An upper surface of the table 50 is formed as a suction surface, and can be adjusted such that an upper surface of the wafer W and an upper surface of the ring frame F have the same height position.

The sticking unit 52 comprises: a support roller 58 for supporting a raw sheet R having the mounting tape T temporarily stuck on one surface of a release liner RL; a winding roller 59 for winding the release liner RL after the mounting tape T is peeled off; a driving means 60 for imparting a feed-out force to the raw sheet R; a peel plate 62 for peeling off the mounting tape T from the release liner RL; and a pressing roller 64 for pressing and sticking the mounting tape T to the surfaces of the wafer W and the ring frame F. The driving means 60 includes a drive roller 66 driven by a motor M3, and a pinch roller 67 for pinching the release liner RL between the drive roller 66 and the pinch roller 67. Note that the mounting tape T has a circular shape that is larger than an inner diameter of the ring frame F, and smaller than an outer diameter of the ring frame F.

The transfer means 18, as shown in FIG. 1, includes a multi-jointed robot 69, and a suction arm 71 provided on the free-end side of an arm 70 of the multi-jointed robot 69. The transfer means 18 adopts the substantially same arrangement as a moving means disclosed in Japanese Patent Application No. 2008-154209 filed by this applicant, and therefore, the description of the detailed structure thereof is omitted.

The full peeling means 19, as shown in FIG. 4, includes: a table 75 for supporting the wafer W united with the ring frame F via the mounting tape T, and capable of moving in a left and right direction in the figure with a slider 90 of a uniaxial robot 76; and a full peeling unit 79 disposed above the table 75, and capable of moving in a left and right direction in the figure through a uniaxial robot 78 disposed parallel with the uniaxial robot 76. The full peeling unit 79 comprises: an arm 83 rotatably supported by a moving frame 81 which is supported by a slider (not shown) of the uniaxial robot 78; a cylinder 84 attached on the free-end side of the arm 83; a suction pad 86 provided on the cylinder 84; and a pressing head 87 provided movably forward and backward with a motor M4. The arm 83 has a substantially L-shape, and provided such that it can be rotated 90 degrees about an axis 85 with a motor (not shown), and moreover, the cylinder 84 is movably provided in the long piece side of the arm.

Next, a mounting method in the embodiment will be described.

Once a wafer W stored in the wafer stocker 12 is transferred onto the rotating table 22 of the alignment means 14 through the transfer means 18, then the rotating table 22 is rotated, the detecting means 23 detects the outer periphery position and the reference position of the wafer W, and the outer periphery position and the reference position is set in a predetermined position.

Figure 2A:
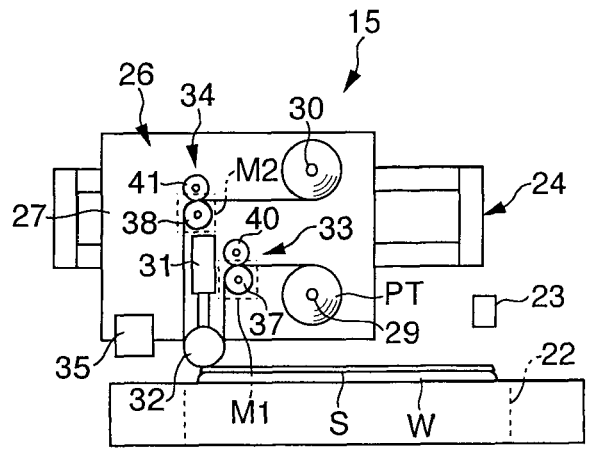
FIGS. 2(A) to 2(B) are explanatory views for the operation of a preliminary peeling means when
Figure 2B:
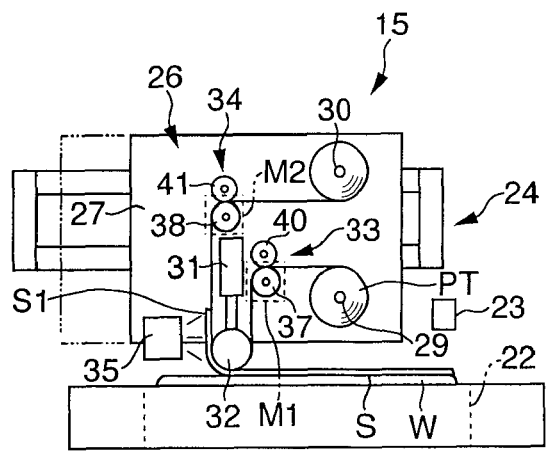

Then, as shown in FIG. 2(A), the cylinder 31 of the preliminary peeling means 15 expands to have the peeling tape PT, which is wound around the press roller 32, adhered to the outer edge portion of the adhesive sheet S. In such a state, the moving frame 27 is moved by a predetermined amount relative to the rotating table 22, while the peeling tape PT is fed-out and wound (see FIG. 2(B)). Thus, the outer edge portion of the adhesive sheet S is adhered to the peeling tape PT, a portion of the adhesive sheet S is preliminarily peeled off, and, the ultraviolet ray irradiating apparatus 35 irradiates an adhesive agent layer of the peeled portion of the adhesive sheet S, with ultraviolet rays. Thus, the portion that has been preliminarily peeled becomes the preliminarily peeled portion S1 that is not able to re-adhere.

Figure 2C:
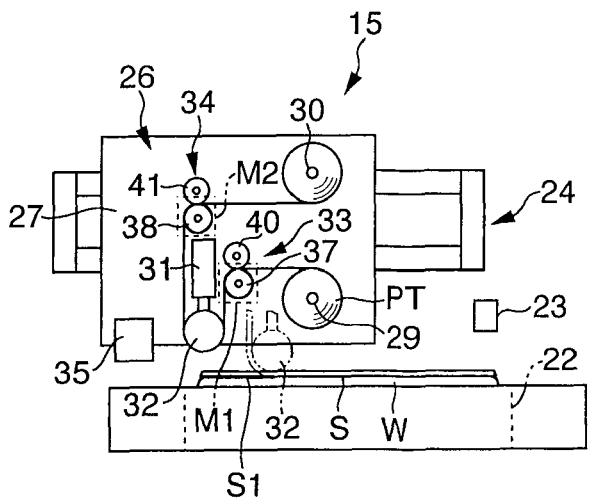

Then, as shown in FIG. 2(C), the moving frame 27 moves leftward, and the press roller 32 is lifted up and retracted. In this way, the portion of the adhesive sheet S is preliminarily peeled off at a stage prior to mounting. By doing this, even when a portion of the peeling tape T comes in contact with the table 22 beyond the outer edge of the wafer W. Therefore, there is no possibility of damage to the wafer W when the portion of the adhesive sheet S is pulled and peeled off as in a conventional case because there is no mounting tape T there. In addition, the peeling tape PT can be firmly adhered under pressure to the outer edge portion of the adhesive sheet S so that sufficient adhesion for the preliminary peeling can be obtained.

When the preliminarily peeled portion S1 is formed in the adhesive sheet S, the wafer W is transferred onto the table 50 of the sticking means 17 onto which a ring frame F has been previously transferred from the frame stocker 11 by the transfer means 18, so that the wafer W is disposed inside the ring frame F.

Figure 3A:
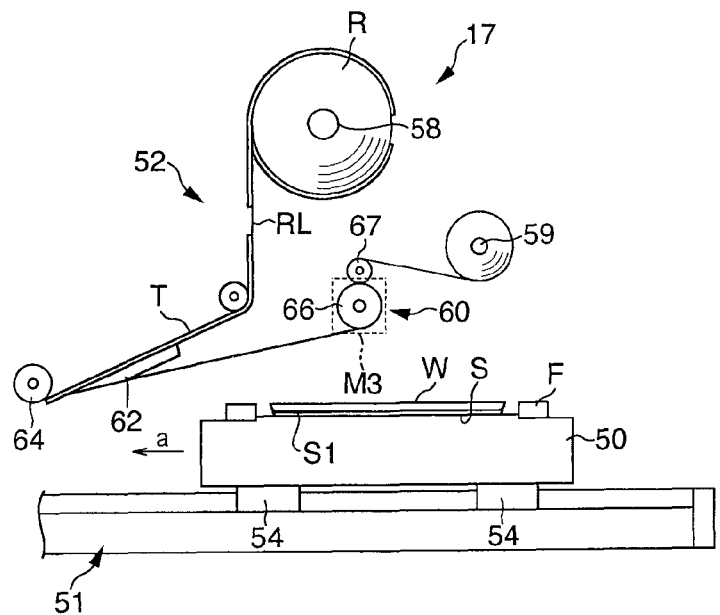
FIGS. 3(A) and 3(B) are explanatory views for the operation of a sticking means when
Figure 3B:
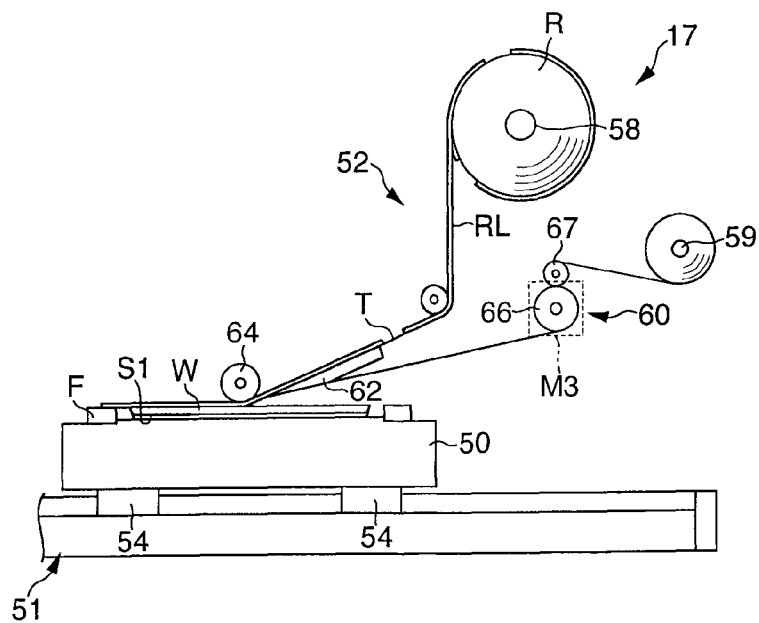

Then, as shown in FIG. 3(A), the table 50 moves in the direction of an arrow a. When a sensor (not shown) detects that the table 50 has reached a predetermined position, the sticking unit 52 is driven to stick a mounting tape T to the ring frame F and the wafer W to unite both, while peeling off the mounting tape T from a release liner RL (see FIG. 3(B)).

The mounted wafer W is transferred onto the table 75 of the full peeling means 19 through the transfer means 18 such that the preliminarily peeled portion S1 is located under the suction pad 86.

Figure 4A:
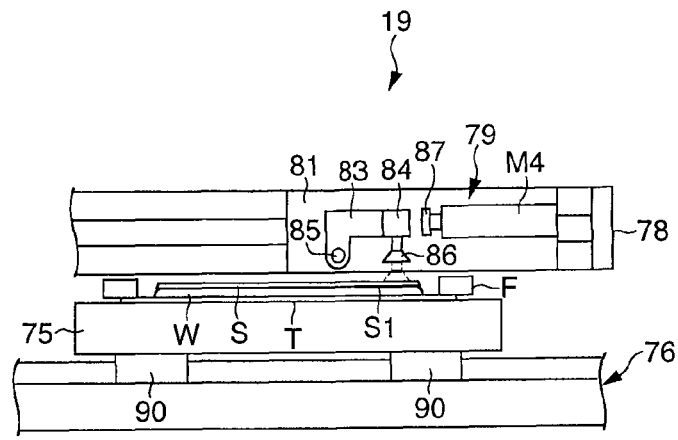
FIGS. 4(A) to 4(B) are explanatory views for the operation of a full peeling means when
Figure 4B:
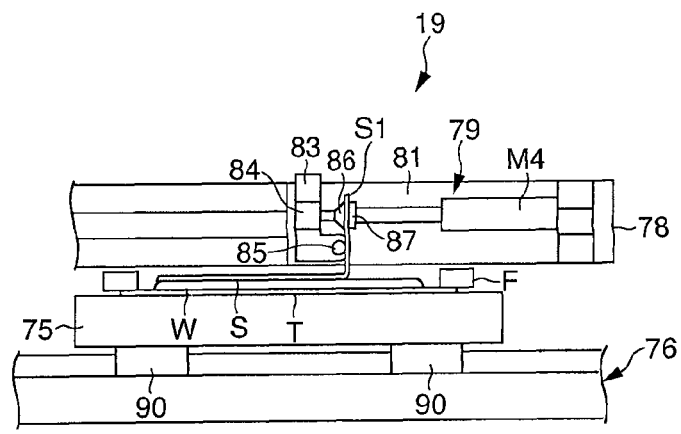
Figure 4C:
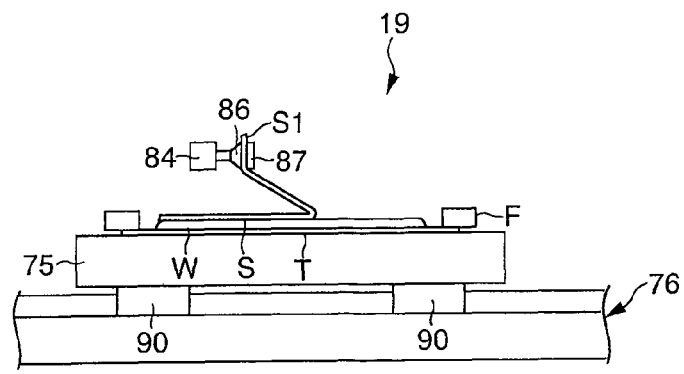

Then, as shown in FIG. 4(A), the cylinder 84 extends to suck the preliminarily peeled portion S1 of the adhesive sheet S by using the suction pad 86, and while keeping this state, the arm 83 is rotated in a counterclockwise direction in FIG. 4 to peel off the preliminarily peeled portion S1 at an angle of about 90 degree. Then, the motor M4 is driven, and the pressing head 87 is moved to suction pad 86 side thereof to sandwich the preliminarily peeled portion S1. While keeping this state, the moving frame 81 moves leftward so that the adhesive sheet S is fully peeled off (see FIGS. 4(B) and 4(C)).

The wafer W, from which the adhesive sheet S has been fully peeled off, is stored into the product stocker 20 through the transfer means 18.

Thus, according to such an embodiment, a portion of the adhesive sheet S is preliminarily peeled off to form the preliminarily peeled portion S1 at a stage prior to mounting the wafer W in the ring frame F. Therefore, the preliminarily peeled portion S1 having reduced adhesion can be easily peeled off from the wafer W after mounting, the peeling tape need not to be stuck as close to the outer edge portion of the adhesive sheet S as possible when the adhesive sheet S is fully peeled off, as in a conventional case, and damage to the wafer can be effectively prevented. Moreover, by providing the preliminarily peeled portion S1, adding an arbitrary property to a peeling form can be achieved, enabling a full peeling to be performed manually.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to shape, location, layout and the like without departing from the technical spirit and the range of the object of the present invention.

For example, the preliminary peeling means 15 is provided to the alignment means 14 in the embodiment, but may be provided in another location other than the alignment means 14. However, providing it to the alignment means 14 enables a part of the apparatus to be shared and can realize a space-savings.

Also, the adhesive layer of the adhesive sheet S is not limited to that of an ultraviolet curable type, but it is only necessary to be an arrangement in which the adhesion in the preliminarily peeled portion can be at least temporarily reduced, such as forming a liquid film on an adhesive surface with spray.

Further, the full peeling means 19 is not limited to the illustrated arrangement example, but may be an arrangement in which the adhesive sheet S may be peeled off from the preliminarily peeled portion S1 as a peeling start position.

Furthermore, although the ring frame F in the above-mentioned embodiment is shown as that of a closed-loop shape, however, any non-looped frame such as a C-ring may be applied thereto.

Still further, the full peeling means 19 may an arrangement in which peeling is carried out by using a peeling tape. In this case, since the preliminarily peeled portion S1 can be easily peeled off from the wafer W, it is not required that the peeling tape is stuck as close to the outer edge portion of the adhesive sheet as possible, like prior art.

Also, the non-adhesive treatment means may be configured such that the preliminarily peeled portion S1 is not re-adhered to the wafer W by folding the preliminarily peeled portion S1 back on the adhesive agent layer side or by sticking another sheet to the adhesive agent layer of the preliminarily peeled portion S1, other than the ultraviolet ray irradiating apparatus 35.

What is claimed is:

1. A mounting apparatus for uniting a semiconductor wafer with a ring frame by sticking a mounting tape to the semiconductor wafer and the ring frame, said mounting apparatus comprising:
 a preliminary peeling means for forming a preliminarily peeled portion by preliminarily peeling off a portion of an adhesive sheet from the semiconductor wafer having the adhesive sheet stuck on one surface of the wafer;
 a sticking means for sticking the mounting tape to the ring frame and the other surface of the semiconductor wafer, by disposing, inside the ring frame, the semiconductor wafer with the preliminarily peeled portion formed in the adhesive sheet; and
 a non-adhesive treatment means for preventing an adhesive layer of the preliminarily peeled portion from re-adhering to the semiconductor wafer.

2. The mounting apparatus according to claim 1, further comprising an alignment means for the semiconductor wafer, wherein the preliminary peeling means is provided to the alignment means.

3. The mounting apparatus according to claim 2, further comprising a full peeling means for peeling off the adhesive sheet from the semiconductor wafer by holding the preliminarily peeled portion.

4. The mounting apparatus according to claim 1, further comprising a full peeling means for peeling off the adhesive sheet from the semiconductor wafer by holding the preliminarily peeled portion.

5. The mounting apparatus according to claim 1, wherein said non-adhesive treatment means is an ultraviolet ray irradiating apparatus.

6. The mounting apparatus according to claim 1, wherein said non-adhesive treatment means is configured for folding the preliminarily peeled portion back on the adhesive layer so that the preliminary peeled portion is not re-adhered to the wafer.

7. The mounting apparatus according to claim 1, wherein said non-adhesive treatment means is configured for sticking another sheet to the adhesive layer of the preliminary peeled portion so that the preliminary peeled portion is not re-adhered to the wafer.

8. A mounting method for uniting a semiconductor wafer with a ring frame by sticking a mounting tape to the semiconductor wafer and the ring frame, said mounting method comprising:
    forming a preliminarily peeled portion by preliminarily peeling off a portion of an adhesive sheet from the semiconductor wafer having the adhesive sheet stuck on one surface of the wafer; and
    sticking the mounting tape to the ring frame and the other surface of the semiconductor wafer by disposing, inside the ring frame, the semiconductor wafer with the preliminarily peeled portion formed in the adhesive sheet;
    wherein the method further comprises a non-adhesive treatment that prevents an adhesive layer of the preliminarily peeled portion from re-adhering to the semiconductor wafer after preliminarily peeling off the portion of the adhesive sheet.

9. The mounting method according to claim 8, further comprising
    fully peeling off the adhesive sheet from the semiconductor wafer by holding the preliminarily peeled portion after sticking the mounting tape.

* * * * *